MULTILOGIC DIGITAL AMPLIFIER CIRCUITS WITH TUNNEL-DIODE COUPLED EMITTER FOLLOWERS
Filed Nov. 30, 1965 2 Sheets-Sheet 1
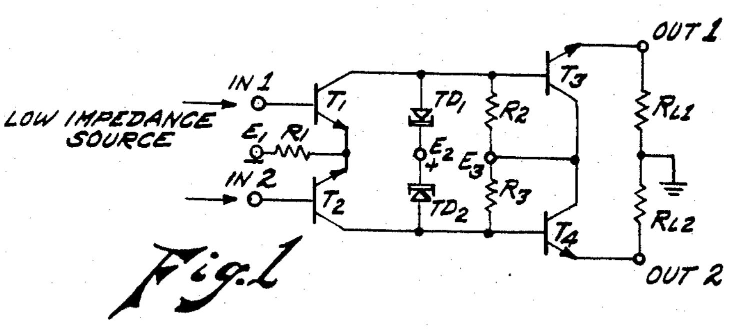
Fig. 1
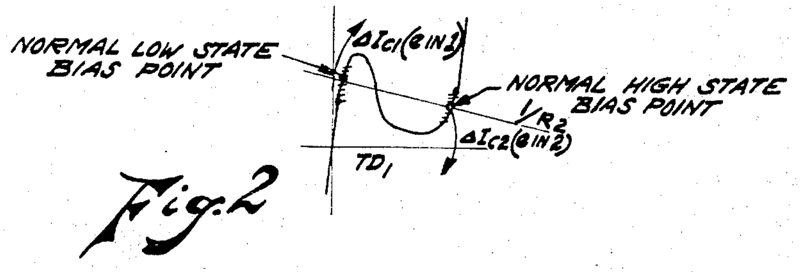
Fig. 2
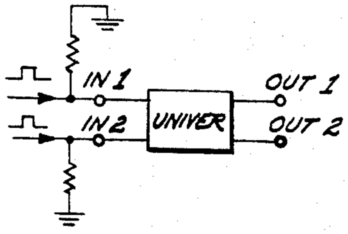
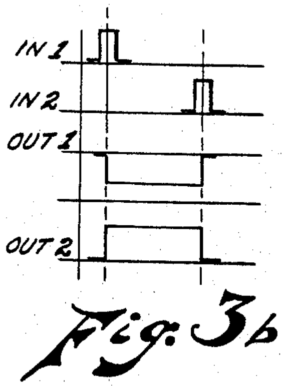
Fig. 3a Fig. 3b
INVENTORS
YOHAN CHO
NORMAN S. ZIMBEL
BY Harry A. Herbert Jr.
and Herbert E. James
ATTORNEYS INVENTORS
YOHAN CHO
NORMAN S. ZIMBEL
BY Harry A. Herbert Jr.
and Herbert E. Farmer
ATTORNEYS United States Patent Office 3,385,979
Patented May 28, 1968

3,385,979

MULTILOGIC DIGITAL AMPLIFIER CIRCUITS WITH TUNNEL-DIODE COUPLED EMITTER FOLLOWERS

Yohan Cho, Harvard, and Norman S. Zimbel, Newton, Mass., assignors to the United States of America as represented by the Secretary of the Air Force Filed Nov. 30, 1965, Ser. No. 510,715
2 Claims. (Cl. 307—286)

ABSTRACT OF THE DISCLOSURE

A multiple-function logic amplifier circuit for digital computers including a pair of tunnel-diode coupled emitter followers driven by an emitter coupled amplifier.

This invention relates to digital computers, and more particularly, to very high-speed digital amplifier circuits.

In ultra-high-speed (100 mc. clock rate) digital logic circuits micro circuit packaging techniques are mandatory. From an economic and user point of view, it is advantageous to have as few package types as possible. Additionally, it is well known that the emitter follower is a very useful circuit configuration for impedance matching with the low-impedance transmission lines which are required for signal propagation in high-speed digital systems. However, the emitter follower circuit has heretofore been avoided in very high-speed digital circuits due to the well-known unstable characteristic of an emitter follower at high frequencies.

Accordingly, an object of this invention is to provide a multilogic digital amplifier circuit based upon a stabilized emitter-follower configuration.

Another object of this invention is to provide a multilogic amplifier circuit having three modes of operation-storage, complementary amplification, and inversion.

A further object of this invention is to provide an ultra-high-speed multiple function logic amplifier having relatively broad component tolerances, and therefore, being capable of being constructed in micro circuit form at relatively low cost.

A still further object of this invention is to provide a basic multilogic amplifier circuit which may serve a variety of digital storage and amplifier functions by appropriate external interconnections.

Briefly, to accomplish the foregoing and additional objects, the present invention comprehends the utilization of a current-steered, tunnel-diode switch coupled to an emitter follower. In the basic novel circuit, a pair of tunnel diodes are driven by a high input impedance emitter-coupled amplifier. The tunnel diodes are switched by current-steering into opposite states when a pulse is applied to one of the inputs. The signals, shaped by the tunnel diode are fed to signal distribution lines through a pair of emitter-followers. The tunnel diodes are biased normally to one of the bistable regions located midway between the peak-to-valley points. The two output signal levels are clamped by the tunnel diodes very low impedance at the bistable points; however, during the switching transition, the emitter-follower sees a relatively high impedance at its input where the effective input impedance involves the negative conductance of the tunnel diode. Accordingly, the range of instability of the emitter-follower is greatly reduced. By having an emitter-follower configuration at the output stage, the outputs of two or more circuits can be buffered to implement the OR logical function (with a positive-going logic pulse) with no additional delay or signal attenuation.

The foregoing and other objects, features and advantages of the invention will be apparent from the following more particular description of preferred embodiments of the invention as illustrated in the accompanying drawings wherein:

FIGURE 1 is a schematic of the basic universal inverter and register circuit UNIVER;

FIGURE 2 illustrates the normal bias points of the tunnel diodes;

Figure 4A:
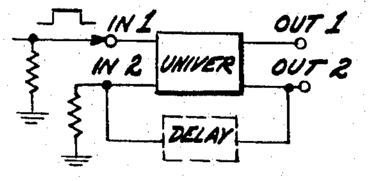
Figure 4B:
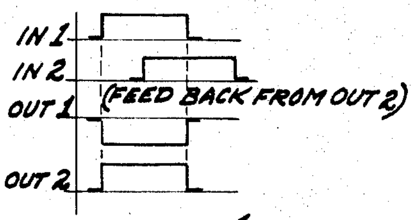
Figure 5:
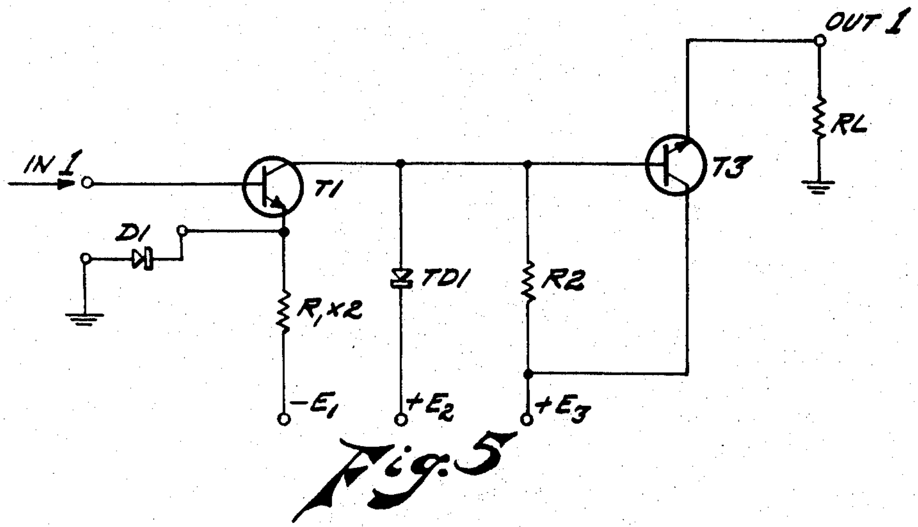

FIGURES 3*a* and 3*b* show the input and output relations for the basic circuit in its flip-flop mode of operation;

FIGURES 4*a* and 4*b* illustrate the input and output relations for the basic circuit in its embodiment as a signal reshaping amplifier; and FIGURE 5 illustrates the basic circuit embodied as an inverter.

The basic UNIVER shown in FIGURE 1 is a flip-flop. A pair of tunnel diode coupled emitter followers which consists of tunnel diode TD1-transistor T3 and tunnel diode TD2-transistor T4, are connected to the emitter coupled to input stage transistors T1 and T2. The input signals are fed to the base of the input transistors marked "IN 1" and "IN 2", and the output signals are delivered to the loads RL1 and RL2 from the emitter of the output transistor T3 and T4, marked "OUT 1" and "OUT 2", respectively. The input transistors, T1 and T2, and the tunnel diodes, TD1, TD2, are biased to the proper operating points by the biasing network consists of resistors R1, R2, R3, and the power supply E1, E2, and E3. Initially, tunnel-diodes TD1 and TD2 are in some arbitrary state. When a positive pulse is applied to input 1 with input 2 held in the ground level, T1 conducts heavily to set TD1 at the low state, while T2 draws less current; this will cause TD2 to set to the high state. Applying a positive pulse to input 2 with input 1 held at ground, the complementary switching sequence occurs. The signal waveforms observed at the input and output of UNIVER circuit in flip-flop operation are shown in FIGURE 3.

Tunnel diodes, TD1 and TD2, are biased normally to one of the bistable regions located midway between the peak-to-valley points as shown in FIGURE 2. Tunnel diode switches TD1 and TD2 are driven by emitter-coupled current-mode amplifiers comprising transistors T1 and T2. Accordingly, TD1 and TD2 are switched from one state to the other by a constant current source, thus yielding most efficient tunnel-diode switching. Output transistors T3 and T4 are non-saturated emitter followers and, therefore, the two output voltages are strictly dictated by tunnel-diode switches TD1 and TD2, respectively, and the base-to-emitter voltage of the emitter followers. It is to be noted that besides stabilization of the emitter-follower circuit, the tunnel diode serves a number of other functions, namely; extension of bandwidth, voltage amplification, and signal thresholding.

It is to be noted in FIGURE 1 that the UNIVER input stage is a difference amplifier, which yields a change of state for the flip-flop only when a difference signal is applied. Thus, with proper biasing, either or both input-signal polarities may be utilized.

FIGURE 4 illustrates utilization of the UNIVER together with use of the difference-amplifier input stage to provide another digital function; namely, as a signal reshaping amplifier. Since the same signal polarity present at input 1 is available at output 2, coupling output 2 to input 2 by means of the delay element permits the UNIVER to operate as an amplifier with complementary outputs. Operation of the circuit illustrated in FIGURE 4 is as follows: the signal at input 1 switches the UNIVER into the set state; the delayed feedback from output 2 to input 2 through a delay element, marked as "DELAY," causes no change since both inputs are "high"; switching the input 1 voltage to ground (low) level results in the UNIVER resetting, since input 2 is still "high."

FIGURE 5 illustrates ½ UNIVER as an inverter, and thus how two independent inverters are obtained through division of the basic UNIVER into two identical circuits and modification of the emitter connection of the input stage. It is assumed here that the bias resistor R1 in FIGURE 1 consists of two resistors (R1×2) in parallel connection, and therefore, dividing the circuit into half, each subdivided circuit contains one (R1×2) resistor. Normally, with the ground level at the input, clamped diode, D1 is conducting; accordingly, input transistor T1 is in the "off" state and tunnel diode TD1 is biased to the high state. When a positive pulse is applied to the input, T1 starts to conduct and sets TD1 in the low state as long as T1 is conducting. Thus signal inversion is obtained.

The above three modes of operation storage, complementary amplification, and inversion are the basic functions of the UNIVER circuit. Knowing the above switching modes of the universal circuit, it can be readily seen that the circuit can be used for various logical functions that will be discussed subsequently.

With simple external connections the instant UNIVER module can be used in six basic logic functions: (1) a set-reset flip-flop (basic UNIVER operation), (2) a shaping amplifier with complementary outputs, (3) a noninverting amplifier with single and double outputs, (4) an inverter with single or double outputs, or two independent inverters, (5) a monostable flop with a variable pulse-width control, and (6) a delay amplifier.

An extensive theoretical analysis of the high frequency or switching characteristics of the UNIVER circuit indicates, in brief, the following:

Since all transistors in the UNIVER are operating in the linear amplification mode, and tunnel diodes are switched under a nearly constant current load, the transient responses are limited by the gain-band-width of the active devices. The stage delay is governed mainly by the HF current gain of the input stage, and the rise-and-fall times are dictated by the tunnel-diode characteristic, the total stray capacitance at the node of the tunnel diode connection, the stray inductance through the signal-propagation path and the HF current gain of the emitter follower. With currently available components (e.g., transistors having $f_t$=1 kmc., Cob, Cie=2 pf.—selected from G.E. 2N918, Sylv. 2N2784 or RCA 2N2857—and tunnel diodes with a peak current of 4.7 ma., a peak-to-valley ratio 8, and a valley capacitance 1 pf.), the typical circuit response times are: the total stage delay or set (reset) delay of nominally 1 nsec., rise-and-fall times of nominally 1.2 nsec. The output signal amplitude is 0.5 v. into a 35-Ω resistive load (equivalent to 15-ma. signal current). Accordingly, flip-flop action up to an 800-mc. set-reset rate (or 400-mc. output switching rate) can be attained for a fully loaded condition.

Since the input impedance of the UNIVER is comparatively high, the logical gains are mainly determined by the impedance level of the signal distribution system. With a 35-Ω impedance level the logical gain is in the range 6∼8. Except for the emitter-clamped inverter mode of operation, the threshold characteristic of the UNIVER is determined by the HF gain of the front stage and the required current to switch the tunnel diode. With a 4.7-ma. peak-current tunnel diode, the threshold level of the UNIVER is typically 0.2 v. and unambiguous triggering occurs for a 0.3-v. input level. The threshold characteristic for the inverter mode of operation is determined mainly by the characteristic of the emitter-clamped diode. Typically, the threshold is 0.23 v. with unambiguous triggering occuring at a 0.3-v. input signal level.

From the above-described embodiments of the instant invention, many advantages and features have been obtained. For example, the fabrication of micro circuits in quantities is now practicable due to the instant UNIVER circuit because the allowable tolerances of the circuit components in the basic circuit are quite broad. For example, the allowable tolerances of the most critical component parameters are ±3% with the power supply regulations of ±5%.

Broad tolerances are possible because: (1) the switching elements, tunnel diodes, are well isolated from both input and outputs circuits through nonsaturated amplifier stages. Accordingly, neither the switching characteristic nor the steady-state bias condition of the tunnel diodes is signficantly affected by the external conditions. (2) The tunnel diodes are used primarily for bistable voltage clamping and wave shaping, and are biased normally midway between the peak-to-valley points with a high impedance load. Accordingly, the permissible bias range of the tunnel diode is fairly wide (approximately one-half of the peak current value). (3) The bias current is a function of input transistors $\alpha(H_{FBO})$ rather than $\beta(H_{FEO})$. (4) With use of the differential amplifier configuration and the silicon transistors, the temperature effects on the circuit are greatly minimized. (5) Due to the low signal amplitude (0.5 v.) and moderately low current level (5∼20 ma.), the power dissipation in the circuit module is relatively low, in spite of the nonsaturated mode operation.

There are still other advantages to the above-described UNIVER circuit. Use of a current triggered tunnel diode circuit driving the base of an emitter-follower transistor stage permits very high switching speeds with the following characteristics: (a) stable emitter-follower operation for ultra-high frequency class transistors and for relatively large capacitance loading to give fast switching and low circuit delay; (b) wave shaping to give rise and fall times of one nanosecond; (c) input noise thresholding; (d) isolation of load from tunnel diode circuit; (e) exceptionally sharp and stable transfer characteristics against temperature change; (f) low output impedance; and (g) option of monostable or bistable operation. Also, with the basic UNIVER circuit, a flip-flop with approximately one nanosecond transit delay may be realized and, due to differential amplifier input, triggering by negative or positive pulses can be accomplished. Also, by addition of gating transistors in parallel with the input stage, a gated flip-flop is implemented. In conclusion, it is to be noted that the basic UNIVER circuit design permits high speed operation (in range one nanosecond per logic function) with fan in, fan out, and component tolerances which, in combination, are superior to any prior art logic circuits in this speed range.

While the foregoing description sets forth the principles of the invention in connection with specific apparatus, it is to be understood that this description in made only by way of example and not as a limitation of the scope of the invention as set forth in the objects thereof and in the accompanying claims.

We claim:

1. A multiple-function logic amplifier circuit for digital computers comprising: dual inputs; an input amplifier stage connected to said dual inputs, said amplifier stage further comprising a first and second transistor, each of said first and second transistors having a base and emitter and collector electrodes, said transistors being in an emitter-coupled relationship, a first biasing means connected to said emitter-coupled connection; a tunnel-diode stage current controlled by said input amplifier stage, said tunnel-diode stage further comprising first and second tunnel-diodes; the anodes of said tunnel-diodes conductively connected to the collector electrodes of said first and second transistors respectively, and a second biasing means connected to the cathode of said first and second tunnel-diodes; an output emitter-follower stage comprising third and fourth transistors, each of said transistors having a base and emitter and collector electrodes, the base of said third and fourth transistors connected to the collector of said first and second transistor respectively and further controlled by said first and second tunnel-diodes respectively, said third and fourth transistors connected in a collector-coupled relationship, a third biasing means connected to said collector-coupled connection and further connected to the base of each of said third and fourth transistors; dual outputs, and resistive load means for biasing the emitter-follower stage connected intermediate the outputs of said third and fourth transistors, whereby said digital circuit provides a flip-flop mode of operation for either positive or negative pulses at said inputs, each of said tunnel-diodes causing the other to be set to a different state when a pulse is applied to its corresponding input.

2. A multiple-function logic amplifier circuit as defined in claim 1 including: a delay means, wherein the input to the delay is connected to the emitter output of said fourth transistor and output is connected to the base input of said second transistor whereby the circuit is provided with a signal reshaping mode of operation.

References Cited

UNITED STATES PATENTS

| | | | |
|---|---|---|---|
| 3,211,921 | 10/1965 | Kaufman et al. ------ | 307—88.5 |
| 3,239,695 | 3/1966 | Neff et al. ---------- | 307—88.5 |

ARTHUR GAUSS, *Primary Examiner.*

J. A. JORDAN, J. D. FREW, *Assistant Examiners.*